US012813063B2

(12) United States Patent
Li et al.

(10) Patent No.: US 12,813,063 B2
(45) Date of Patent: Nov. 24, 2026

(54) ORGANIC LIGHT-EMITTING DIODE, DISPLAY PANEL AND DISPLAY DEVICE

(71) Applicants: Hefei BOE Joint Technology Co., Ltd., Hefei (CN); BOE Technology Group Co., Ltd., Beijing (CN)

(72) Inventors: Xinyu Li, Beijing (CN); Xinxin Wang, Beijing (CN); Xiang Wan, Beijing (CN); Cheng Xu, Beijing (CN); Dandan Zhou, Beijing (CN); Ningning Wang, Beijing (CN)

(73) Assignees: HEFBI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 383 days.

(21) Appl. No.: 18/577,282

(22) PCT Filed: Mar. 16, 2023

(86) PCT No.: PCT/CN2023/081790
§ 371 (c)(1),
(2) Date: Jan. 8, 2024

(87) PCT Pub. No.: WO2024/187440
PCT Pub. Date: Sep. 19, 2024

(65) Prior Publication Data
US 2025/0107317 A1 Mar. 27, 2025

(51) Int. Cl.
*H10K 50/13* (2023.01)
*H10K 50/15* (2023.01)
(Continued)

(52) U.S. Cl.
CPC ........... *H10K 50/13* (2023.02); *H10K 50/156* (2023.02); *H10K 50/19* (2023.02); *H10K 59/35* (2023.02); *H10K 2102/351* (2023.02)

(58) Field of Classification Search
CPC .............................. H10K 50/13; H10K 50/19
See application file for complete search history.

(56) References Cited

U.S. PATENT DOCUMENTS

2011/0233528 A1 9/2011 Levermore et al.
2014/0183496 A1 7/2014 Heo et al.
(Continued)

FOREIGN PATENT DOCUMENTS

CN 103915569 A 7/2014
CN 107221605 A 9/2017
(Continued)

*Primary Examiner* — Erik Kielin
(74) *Attorney, Agent, or Firm* — XSENSUS LLP

(57) ABSTRACT

Provided is an organic light-emitting diode, including a first electrode, a second electrode, at least two emission layers, a first hole transport layer and a second hole transport layer. A color of a mixture of light emitted from the at least two emission layers is white. The at least two emission layers includes a first emission layer and a second emission layer. The first electrode, the first emission layer, the first hole transport layer, the second hole transport layer, the second emission layer, and the second electrode are disposed on a base substrate and are sequentially laminated in a direction going away from the base substrate. A thickness of the second hole transport layer is greater than a first thickness threshold. A ratio of the thickness of the second hole transport layer to a thickness of the first hole transport layer ranges from 15 to 40.

16 Claims, 5 Drawing Sheets

| film layer | thickness range (nm) |
|---|---|
| second electrode (cathode IZO) | 80-120 |
| electron injection layer (EIL) | 80-100 |
| first hole block layer (HBL) | 5-20 |
| second emission layer (B-EML) | 10-30 |
| second electron block layer (EBL) | 5-20 |
| second hole transport layer (HTL) | 150-200 |
| fifth hole transport layer (P-HTL) | 5-20 |
| second charge generation layer (N-CGL) | 5-20 |
| third emission layer (Y-EML) | 30-60 |
| fourth emission layer (R-EML) | 5-20 |
| first hole transport layer (HTL) | 5-10 |
| fourth hole transport layer (P-HTL) | 5-10 |
| first charge generation layer (N-CGL) | 5-10 |
| second hole block layer (HBL) | 5-20 |
| first emission layer (B-EML) | 10-30 |
| first electron block layer (EBL) | 5-20 |
| third hole transport layer (HTL) | 90-130 |
| hole injection layer (HIL) | 5-20 |
| first electrode (anode ITO) | 5-20 |
| reflective layer | 50-100 |

(51) Int. Cl.

| | |
|---|---|
| ***H10K 50/19*** | (2023.01) |
| ***H10K 59/35*** | (2023.01) |
| ***H10K 102/00*** | (2023.01) |

(56) References Cited

U.S. PATENT DOCUMENTS

| | | | | |
|---|---|---|---|---|
| 2018/0358416 | A1 | 12/2018 | Hamada | |
| 2019/0006434 | A1 | 1/2019 | Hua et al. | |
| 2019/0280055 | A1 | 9/2019 | Hack et al. | |
| 2020/0058874 | A1* | 2/2020 | Kim | C09K 11/06 |
| 2022/0173323 | A1* | 6/2022 | Yu | C09K 11/06 |
| 2022/0209115 | A1* | 6/2022 | Yu | C09K 11/06 |
| 2023/0217668 | A1* | 7/2023 | Cho | H10K 50/12 257/40 |

FOREIGN PATENT DOCUMENTS

| | | | |
|---|---|---|---|
| CN | 107275502 | A | 10/2017 |
| CN | 107359261 | A | 11/2017 |
| CN | 108878504 | A | 11/2018 |
| CN | 115347028 | A | 11/2022 |
| JP | 2009-016478 | A | 1/2009 |
| JP | 2014-182933 | A | 9/2014 |

* cited by examiner

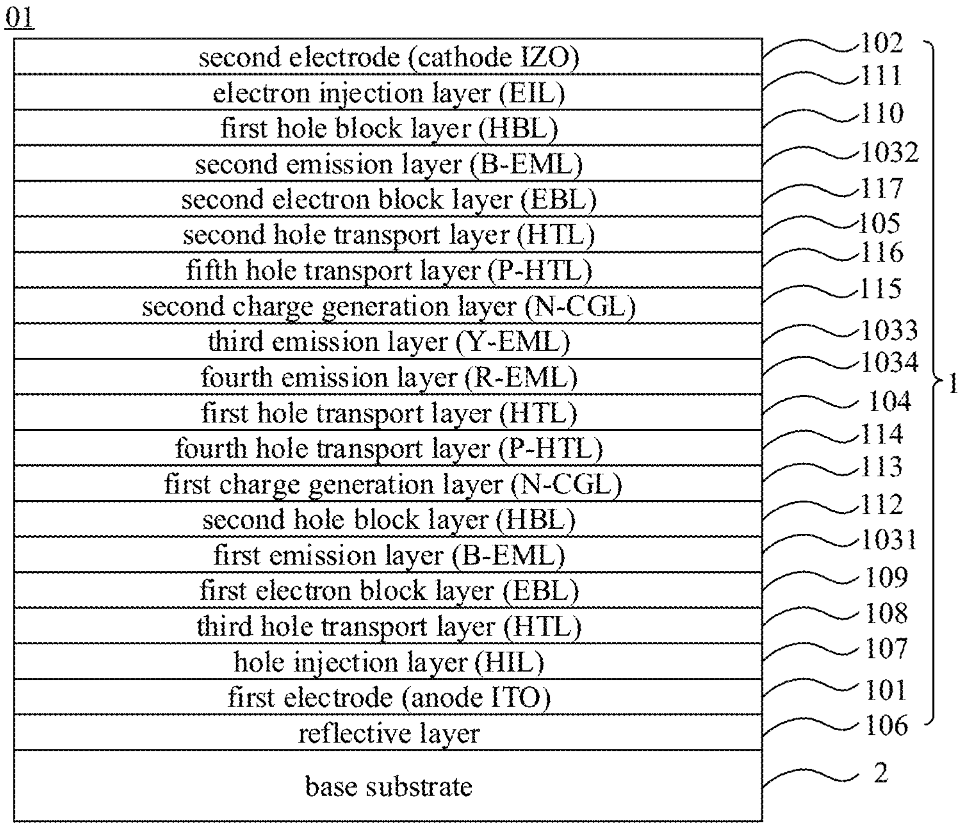

FIG. 3

| film layer | thickness range (nm) |
|---|---|
| second electrode (cathode IZO) | 80-120 |
| electron injection layer (EIL) | 80-100 |
| first hole block layer (HBL) | 5-20 |
| second emission layer (B-EML) | 10-30 |
| second electron block layer (EBL) | 5-20 |
| second hole transport layer (HTL) | 150-200 |
| fifth hole transport layer (P-HTL) | 5-20 |
| second charge generation layer (N-CGL) | 5-20 |
| third emission layer (Y-EML) | 30-60 |
| fourth emission layer (R-EML) | 5-20 |
| first hole transport layer (HTL) | 5-10 |
| fourth hole transport layer (P-HTL) | 5-10 |
| first charge generation layer (N-CGL) | 5-10 |
| second hole block layer (HBL) | 5-20 |
| first emission layer (B-EML) | 10-30 |
| first electron block layer (EBL) | 5-20 |
| third hole transport layer (HTL) | 90-130 |
| hole injection layer (HIL) | 5-20 |
| first electrode (anode ITO) | 5-20 |
| reflective layer | 50-100 |

FIG. 4

| film layer | thickness range (nm) |
|---|---|
| second electrode (cathode IZO) | 80-120 |
| electron injection layer (EIL) | 80-100 |
| first hole block layer (HBL) | 5-20 |
| second emission layer (B-EML) | 10-30 |
| second electron block layer (EBL) | 5-20 |
| second hole transport layer (HTL) | 150-200 |
| fifth hole transport layer (P-HTL) | 5-20 |
| second charge generation layer (N-CGL) | 5-20 |
| third emission layer (Y-EML) | 30-60 |
| fourth emission layer (R-EML) | 5-20 |
| first hole transport layer (HTL) | 5-10 |
| fourth hole transport layer (P-HTL) | 5-10 |
| first charge generation layer (N-CGL) | 5-10 |
| second hole block layer (HBL) | 5-20 |
| first emission layer (B-EML) | 10-30 |
| first electron block layer (EBL) | 5-10 |
| third hole transport layer (HTL) | 5-50 |
| hole injection layer (HIL) | 5-10 |
| first electrode (anode ITO) | 5-10 |
| reflective layer | 50-100 |

FIG. 5

| film layer | thickness range (nm) |
|---|---|
| second electrode (cathode IZO) | 80-120 |
| electron injection layer (EIL) | 80-100 |
| first hole block layer (HBL) | 5-20 |
| second emission layer (B-EML) | 10-30 |
| second electron block layer (EBL) | 5-20 |
| second hole transport layer (HTL) | 150-200 |
| fifth hole transport layer (P-HTL) | 5-20 |
| second charge generation layer (N-CGL) | 5-20 |
| third emission layer (Y-EML) | 30-60 |
| fourth emission layer (R-EML) | 5-20 |
| first hole transport layer (HTL) | 5-10 |
| fourth hole transport layer (P-HTL) | 5-10 |
| first charge generation layer (N-CGL) | 5-10 |
| second hole block layer (HBL) | 5-20 |
| first emission layer (B-EML) | 10-30 |
| first electron block layer (EBL) | 20-35 |
| third hole transport layer (HTL) | 170-210 |
| hole injection layer (HIL) | 20-35 |
| first electrode (anode ITO) | 5-20 |
| reflective layer | 50-100 |

FIG. 6

| film layer | thickness range (nm) |
|---|---|
| second electrode (cathode IZO) | 80-120 |
| electron injection layer (EIL) | 80-100 |
| first hole block layer (HBL) | 5-20 |
| second emission layer (B-EML) | 10-30 |
| second electron block layer (EBL) | 5-20 |
| second hole transport layer (HTL) | 150-200 |
| fifth hole transport layer (P-HTL) | 5-20 |
| second charge generation layer (N-CGL) | 5-20 |
| third emission layer (Y-EML) | 30-60 |
| fourth emission layer (R-EML) | 5-20 |
| first hole transport layer (HTL) | 5-10 |
| fourth hole transport layer (P-HTL) | 5-10 |
| first charge generation layer (N-CGL) | 5-10 |
| second hole block layer (HBL) | 5-20 |
| first emission layer (B-EML) | 10-30 |
| first electron block layer (EBL) | 5-20 |
| third hole transport layer (HTL) | 5-20 |
| hole injection layer (HIL) | 5-20 |
| first electrode (anode ITO) | 80-100 |
| reflective layer | 50-100 |

FIG. 7

| film layer | thickness range (nm) |
|---|---|
| second electrode (cathode IZO) | 80-120 |
| electron injection layer (EIL) | 80-100 |
| first hole block layer (HBL) | 5-20 |
| second emission layer (B-EML) | 10-30 |
| second electron block layer (EBL) | 5-20 |
| second hole transport layer (HTL) | 150-200 |
| fifth hole transport layer (P-HTL) | 5-20 |
| second charge generation layer (N-CGL) | 5-20 |
| third emission layer (Y-EML) | 30-60 |
| fourth emission layer (R-EML) | 5-20 |
| first hole transport layer (HTL) | 5-10 |
| fourth hole transport layer (P-HTL) | 5-10 |
| first charge generation layer (N-CGL) | 5-10 |
| second hole block layer (HBL) | 5-20 |
| first emission layer (B-EML) | 10-30 |
| first electron block layer (EBL) | 5-20 |
| third hole transport layer (HTL) | 90-130 |
| hole injection layer (HIL) | 5-20 |
| first electrode (anode ITO) | 5-20 |
| reflective layer | 50-100 |

FIG. 8

ORGANIC LIGHT-EMITTING DIODE, DISPLAY PANEL AND DISPLAY DEVICE

CROSS-REFERENCE TO RELATED APPLICATION

The present disclosure is a U.S. national stage of international application No. PCT/CN2023/081790, filed on Mar. 16, 2023, the content of which is herein incorporated by reference in its entirety.

TECHNICAL FIELD

The present disclosure relates to the field of display technologies, and in particular, to an organic light-emitting diode, a display panel and a display device.

BACKGROUND

Organic light-emitting diodes (OLEDs) are widely used in display panels because of their advantages such as self-illuminance, wide viewing angle, high contrast, fast response and flexible display.

SUMMARY

The present disclosure provides an organic light-emitting diode, a display panel and a display device. The technical solutions are as follows.

According to some embodiments of the present disclosure, an organic light-emitting diode is provided. The organic light-emitting diode includes: a first electrode, a second electrode, at least two emission layers, a first hole transport layer and a second hole transport layer; wherein a color of a mixture of light emitted from the at least two emission layers is white, and the at least two emission layers includes a first emission layer and a second emission layer, wherein the first electrode, the first emission layer, the first hole transport layer, the second hole transport layer, the second emission layer, and the second electrode are disposed on a base substrate and are sequentially laminated in a direction going away from the base substrate;

a thickness of the second hole transport layer is greater than a first thickness threshold, and a ratio of the thickness of the second hole transport layer to a thickness of the first hole transport layer ranges from 15 to 40.

In some embodiments, the thickness of the second hole transport layer is less than a second thickness threshold;

wherein the second thickness threshold is greater than the first thickness threshold.

In some embodiments, the first thickness threshold is 150 nm, and the second thickness threshold is 200 nm.

In some embodiments, the thickness of the first hole transport layer ranges from 5 nm to 10 nm.

In some embodiments, the at least two emission layers further include: a third emission layer disposed between the first emission layer and the second emission layer; wherein a color of light emitted from the first emission layer is the same as a color of light emitted from the second emission layer, and a color of light emitted from the third emission layer is different from the color of the light emitted from the first emission layer.

In some embodiments, the first hole transport layer is disposed between the first emission layer and the third emission layer, and the second hole transport layer is disposed between the third emission layer and the second emission layer.

In some embodiments, the at least two emission layers further include: a fourth emission layer disposed between the first emission layer and the third emission layer; wherein a color of light emitted from the fourth emission layer is different from the color of the light emitted from the first emission layer, and is different from the color of the light emitted from the third emission layer.

In some embodiments, the organic light-emitting diode further includes: a reflective layer disposed on a side of the first electrode close to the base substrate, and a hole injection layer, a third hole transport layer and a first electron block layer which are disposed between the first electrode and the first emission layer and are sequentially laminated in the direction going away from the base substrate; wherein a thickness of the reflective layer ranges from 50 nm to 100 nm, a thickness of the first electrode ranges from 5 nm to 20 nm, a thickness of the hole injection layer ranges from 5 nm to 20 nm, a thickness of the third hole transport layer ranges from 90 nm to 130 nm, and a thickness of the first electron block layer ranges from 5 nm to 20 nm.

In some embodiments, the organic light-emitting diode further includes: a first hole block layer and an electron injection layer which are disposed between the second emission layer and the second electrode and are sequentially laminated in the direction going away from the base substrate; wherein a thickness of the first hole block layer ranges from 5 nm to 20 nm, and a thickness of the electron injection layer ranges from 80 nm to 100 nm.

In some embodiments, the organic light-emitting diode further includes: a first hole block layer and an electron injection layer which are disposed between the second emission layer and the second electrode and are sequentially laminated in the direction going away from the base substrate; wherein a thickness of the first hole block layer ranges from 15 nm to 30 nm, and a thickness of the electron injection layer ranges from 180 nm to 200 nm.

In some embodiments, the organic light-emitting diode further includes: a reflective layer disposed on a side of the first electrode close to the base substrate, and a hole injection layer, a third hole transport layer and a first electron block layer which are disposed between the first electrode and the first emission layer and are sequentially laminated in the direction going away from the base substrate; wherein a thickness of the reflective layer ranges from 50 nm to 100 nm, a thickness of the first electrode ranges from 5 nm to 10 nm, a thickness of the hole injection layer ranges from 5 nm to 10 nm, a thickness of the third hole transport layer ranges from 5 nm to 50 nm, and a thickness of the first electron block layer ranges from 5 nm to 10 nm.

In some embodiments, the organic light-emitting diode further includes: a reflective layer disposed on a side of the first electrode close to the base substrate, and a hole injection layer, a third hole transport layer and a first electron block layer which are disposed between the first electrode and the first emission layer and are sequentially laminated in the direction going away from the base substrate; wherein a thickness of the reflective layer ranges from 50 nm to 100 nm, a thickness of the first electrode ranges from 5 nm to 20 nm, a thickness of the hole injection layer ranges from 20 nm to 25 nm, a thickness of the third hole transport layer ranges from 170 nm to 210 nm, and a thickness of the first electron block layer ranges from 20 nm to 35 nm.

In some embodiments, the organic light-emitting diode further includes: a reflective layer disposed on a side of the first electrode close to the base substrate, and a hole injection layer, a third hole transport layer and a first electron block layer which are disposed between the first electrode and the first emission layer and are sequentially laminated in the direction going away from the base substrate; wherein a thickness of the reflective layer ranges from 50 nm to 100 nm, a thickness of the first electrode ranges from 80 nm to 100 nm, a thickness of the hole injection layer ranges from 5 nm to 20 nm, a thickness of the third hole transport layer ranges from 5 nm to 20 nm, and a thickness of the first electron block layer ranges from 5 nm to 20 nm.

In some embodiments, the organic light-emitting diode further includes: a second hole block layer, a first charge generation layer and a fourth hole transport layer which are disposed between the first emission layer and the third emission layer, wherein the second hole block layer, the first charge generation layer, the fourth hole transport layer and the first hole transport layer are sequentially laminated in the direction going away from the base substrate; wherein a thickness of the second hole block layer ranges from 5 nm to 20 nm, a thickness of the first charge generation layer ranges from 5 nm to 10 nm, and a thickness of the fourth hole transport layer ranges from 5 nm to 10 nm.

In some embodiments, the organic light-emitting diode further includes: a second charge generation layer, a fifth hole transport layer and a second electron block layer which are disposed between the third emission layer and the second emission layer, wherein the second charge generation layer, the fifth hole transport layer, the first hole transport layer and the second electron block layer are sequentially laminated in the direction going away from the base substrate; wherein a thickness of the second charge generation layer ranges from 5 nm to 20 nm, a thickness of the fifth hole transport layer ranges from 5 nm to 20 nm, and a thickness of the second electron block layer ranges from 5 nm to 20 nm.

In some embodiments, a thickness of the first emission layer ranges from 10 nm to 40 nm, a thickness of the second emission layer ranges from 10 nm to 30 nm, a thickness of the third emission layer ranges from 30 nm to 60 nm, and a thickness of the second electrode ranges from 80 nm to 120 nm.

According to some embodiments of the present disclosure, a display panel is provided. The display panel includes a base substrate, and a plurality of organic light-emitting diodes as described above, wherein the plurality of organic light-emitting diodes are disposed on a side of the base substrate.

According to some embodiments of the present disclosure, a display device is provided. The display device includes: a power supply assembly, and the display panel as described above; wherein the power supply assembly is configured to supply power to the display panel.

BRIEF DESCRIPTION OF DRAWINGS

For a clearer description of the technical solutions in the embodiments of the present disclosure, the following briefly introduces the accompanying drawings required for describing the embodiments. The accompanying drawings in the following descriptions show merely some embodiments of the present disclosure, and persons of ordinary skill in the art may still derive other drawings from these accompanying drawings without creative effort.

FIG. 3 is a schematic structural diagram of another display panel according to some embodiments of the present disclosure;

FIG. 4 is a schematic diagram of thicknesses of film layers of an organic light-emitting diode according to some embodiments of the present disclosure;

FIG. 5 is a schematic diagram of thicknesses of film layers of another organic light-emitting diode according to some embodiments of the present disclosure;

FIG. 6 is a schematic diagram of thicknesses of film layers of yet another organic light-emitting diode according to some embodiments of the present disclosure;

FIG. 7 is a schematic diagram of thicknesses of film layers of still another organic light-emitting diode according to some embodiments of the present disclosure;

FIG. 8 is a schematic diagram of thicknesses of film layers of still another organic light-emitting diode according to some embodiments of the present disclosure.

DETAILED DESCRIPTION

To make the objectives, technical solutions and advantages of the present disclosure clearer, the present disclosure will be further described in detail below with reference to the accompanying drawings.

In the related art, a display panel includes a plurality of organic light-emitting diodes, and the organic light-emitting diode includes an anode, a cathode, and an organic light-emitting film layer disposed between the anode and the cathode. The distance between the anode layer and the cathode layer (the thickness of the organic light-emitting film layer) is referred to as a microcavity length, and the microcavity length affects the optical performance of the organic light-emitting diode. Therefore, the design of the thickness of the organic light-emitting film layer has a big influence on the optical performance of the organic light-emitting diode.

However, in the related art, due to the thickness of the organic light-emitting film layer, it is difficult to achieve better optical performance of the organic light-emitting diode, resulting in a poor display effect of the display panel.

Figure 1:
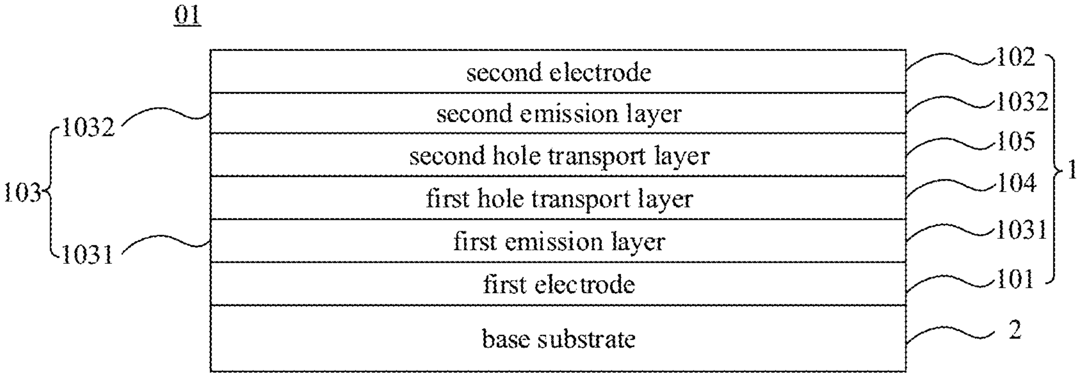
FIG. 1 is a schematic structural diagram of a display panel according to some embodiments of the present disclosure.

FIG. 1 is a schematic structural diagram of a display panel according to some embodiments of the present disclosure. Referring to FIG. 1, the organic light-emitting diode 1 in the display panel includes a first electrode 101, a second electrode 102, at least two emission layers (EML) 103, a first hole transport layer (HTL) 104, and a second hole transport layer 105.

The color of a mixture of light emitted from the at least two emission layers 103 is white, that is, the organic light-emitting diode 1 is configured to emit white light.

Referring to FIG. 1, the at least two emission layers 103 include a first emission layer 1031 and a second emission layer 1032. Furthermore, the first electrode 101, the first emission layer 1031, the first hole transport layer 104, the second hole transport layer 105, the second emission layer 1032 and the second electrode 102 are disposed on a base substrate 2 and are sequentially laminated in a direction going away from the base substrate 2.

The thickness of the second hole transport layer 105 is greater than a first thickness threshold, and the ratio of the thickness of the second hole transport layer 105 to the thickness of the first hole transport layer 104 ranges from 15 to 40.

In the embodiments of the present disclosure, the thickness of the second hole transport layer 105 in the organic light-emitting diode 1 is greater than the first thickness threshold, that is, the second hole transport layer 105 is relatively thicker. In addition, the ratio of the thickness of the second hole transport layer 105 to the thickness of the first hole transport layer 104 is relatively large. Therefore, there is a larger modulation range for the thickness of the second hole transport layer 105. Thus, in the case that the thicknesses of other film layers between the first electrode 101 and the second electrode 102 vary, the second hole transport layer 105 having a different thickness can be provided to adjust the microcavity length of the organic light-emitting diode 1, thereby ensuring the optical performance of the organic light-emitting diode 1 and the display effect of the display panel.

In some embodiments, the first electrode 101 is an anode, and the second electrode 102 is a cathode. Under the driving of an applied driving voltage, electrons from the second electrode 102 and holes from the first electrode 101 move to the emission layers of the organic light-emitting diode 1. When the holes and electrons meet at the emission layers, energy excitons are generated, to excite light-emitting molecules to generate visible light.

In some embodiments, the material of the first electrode 101 is indium tin oxide (ITO), and the material of the second electrode 102 is indium zinc oxide (IZO). Indium zinc oxide is generally prepared by a sputtering process.

In summary, the embodiments of the present disclosure provide an organic light-emitting diode. The organic light-emitting diode includes a first electrode, a second electrode, at least two emission layers, a first hole transport layer and a second hole transport layer. The second hole transport layer is relatively thicker, and the ratio of the thickness of the second hole transport layer to the thickness of the first hole transport layer is larger. Therefore, in the case that the thicknesses of other film layers between the first electrode and the second electrode vary, the second hole transport layer having a different thickness can be provided to adjust the microcavity length of the organic light-emitting diode, thereby ensuring the optical performance of the organic light-emitting diode and the display effect of the display panel.

In some embodiments, the electron mobility of the second hole transport layer 105 ranges from $10^{-1}$ $cm^2/V \cdot S$ (square centimeter/volt·second) to 10 $cm^2/V \cdot S$.

The thickness of the second hole transport layer 105 is less than a second thickness threshold, and the second thickness threshold is greater than the first thickness threshold. That is, the second hole transport layer 105 is not too thick, which can ensure the hole transport efficiency of the second hole transport layer 105 and ensure that the electrons generated by the second electrode 102 are reliably injected into the emission layers.

The thickness of the second hole transport layer 105 is not only greater than the first thickness threshold but also less than the second thickness threshold, which can not only ensure the good optical performance of the organic light-emitting diode 1, but also ensure the hole transport and electron injection. Thus, the display panel has a good display effect.

In some embodiments, the first thickness threshold is 150 nm, and the second thickness threshold is 200 nm. That is, the thickness of the second hole transport layer 105 ranges from 150 nm to 200 nm.

TABLE 1

| Thickness | | C.E. | | | Green color film | | Red color film | | DCIP | Life- |
|---|---|---|---|---|---|---|---|---|---|---|
| (nm) | V | (cd/A) | CIEx | CIEy | CIEx | CIEy | CIEx | CIEy | 3-1976 | span |
| 10-20 | 100% | 100% | 0.298 | 0.318 | 0.285 | 0.667 | 0.676 | 0.323 | 97.2% | 100% |
| 150-200 | 102% | 87% | 0.288 | 0.314 | 0.271 | 0.687 | 0.680 | 0.319 | 99.30% | 104% |

Figure 2:
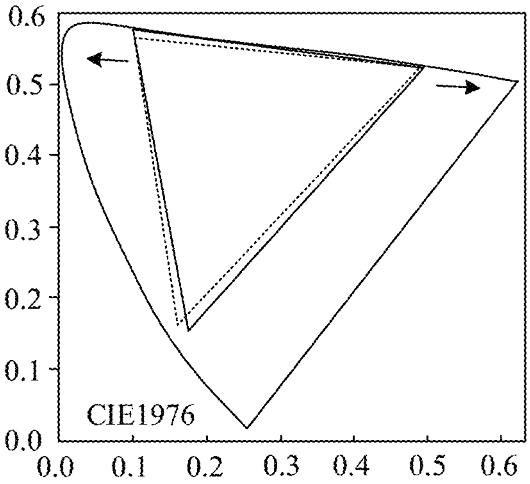
FIG. 2 is a schematic diagram of a color space according to some embodiments of the present disclosure.

As can be seen from Table 1 above, compared with the solution in which the thickness of the second hole transport layer 105 ranges from 10 nm to 20 nm, in the solution in which the thickness of the second hole transport layer 105 ranges from 150 nm to 200 nm, the voltage (V), the color dot (CIEx), the color dot (CIEy) and the lifespan do not change greatly. Furthermore, referring to FIG. 2, the color point passing through the green color film is relatively blue shifted (a green to blue shift from a coordinate (0.109, 0.575) to a coordinate (0.102, 0.576) as shown in FIG. 2), and the color point is changed from a coordinate (0.285, 0.667) to a coordinate (0.271, 0.678). The color point passing through the red color film is relatively red shifted (a red to red shift from a coordinate (0.490, 0.526) to a coordinate (0.497, 0.525) as shown in FIG. 2), and the color point is changed from a coordinate (0.676, 0.323) to a coordinate (0.680, 0.319). The DCI-P3 color gamut is extended from 97.2% to 99.3%, with the gamut range being increased and the gamut values reaching a higher level. In addition, although the increase in the thickness of the second hole transport layer 105 slightly affects the light-emitting efficiency, for example from 100% to 85% in Table 1, such a light-emitting efficiency can still meet the product requirements.

The solid triangle in FIG. 2 is used to represent a CIE1976 color space of the color gamut standard DCI-P3, and the dotted triangle is used to represent a color space in which the thickness of the second hole transport layer ranges from 10 nm to 20 nm.

In Table 1, the thickness refers to the thickness of the second hole transport layer 105, the green color film refers to the color points passing through the green color film, and the red color film refers to the color points passing through the red color film. The lifespan refers to the lifespan when the current density is 50 J and the light-emitting efficiency decreases to 95%, which is denoted as LT95@50 J.

In the embodiments of the present disclosure, the ratio of the thickness of the second hole transport layer 105 to the thickness of the first hole transport layer 104 ranges from 15 to 40. The thickness of the second hole transport layer 105 ranges from 150 nm to 200 nm, and thus the thickness of the first hole transport layer 104 ranges from 5 nm to 10 nm.

Referring to FIG. 3, the at least two emission layers 103 further include a third emission layer 1033 disposed between the first emission layer 1031 and the second emission layer 1032. The color of the light emitted from the first emission layer 1031 is the same as the color of the light emitted from the second emission layer 1032, and the color of the light emitted from the third emission layer 1033 is different from the color of the light emitted from the first emission layer 1031.

In some embodiments, the color of the light emitted from the first emission layer 1031 and the color of the light emitted from the second emission layer 1032 are blue (B), and the color of the light emitted from the third emission layer 1033 is yellow (Y). That is, the first emission layer 1031 and the second emission layer 1032 are blue emission layers (B-EML), and the third emission layer 1033 is a yellow emission layer (Y-EML).

Additionally, the first hole transport layer 104 is disposed between the first emission layer 1031 and the third emission layer 1033, and the second hole transport layer 105 is disposed between the third emission layer 1033 and the second emission layer 1032. That is, in the solution of the embodiments of the present disclosure, the hole transport layer disposed between the third emission layer 1033 and the second emission layer 1032 is set to be thicker.

Furthermore, the at least two emission layers 103 further include a fourth emission layer 1034 disposed between the first emission layer 1031 and the third emission layer 1033. The color of the light emitted from the fourth emission layer 1034 is different from the color of the light emitted from the first emission layer 1031, and is different from the color of the light emitted from the third emission layer 1033. In some embodiments, the color of the light emitted from the fourth emission layer 1034 is red (R). That is, the fourth emission layer 1034 is a red emission layer (R-EML).

As can be seen from FIG. 3, the organic light-emitting diode 1 further includes a reflective layer 106 disposed on the side of the first electrode 101 close to the base substrate 2, and a hole injection layer (HIL) 107, a third hole transport layer 108 and a first electron block layer (EBL) 109 which are disposed between the first electrode 101 and the first emission layer 1031 and are sequentially laminated in the direction going away from the base substrate 2. The material of the reflective layer 106 is at least one of aluminum (Al), argentum (Ag), and molybdenum (Mo).

In some embodiments, the thickness of the reflective layer 106 ranges from 50 nm to 100 nm, the thickness of the first electrode 101 ranges from 5 nm to 20 nm, the thickness of the hole injection layer 107 ranges from 5 nm to 20 nm, the thickness of the third hole transport layer 108 ranges from 90 nm to 130 nm, and the thickness of the first electron block layer 109 ranges from 5 nm to 20 nm. Alternatively, the thickness of the first electrode 101 ranges from 5 nm to 10 nm, the thickness of the hole injection layer 107 ranges from 5 nm to 10 nm, the thickness of the first hole transport layer 104 ranges from 5 nm to 50 nm, and the thickness of the first electron block layer 109 ranges from 5 nm to 10 nm. Alternatively, the thickness of the first electrode 101 ranges from 5 nm to 20 nm, the thickness of the hole injection layer 107 ranges from 20 nm to 25 nm, the thickness of the first hole transport layer 104 ranges from 170 nm to 210 nm, and the thickness of the first electron block layer 109 ranges from 20 nm to 35 nm. Alternatively, the thickness of the first electrode 101 ranges from 80 nm to 100 nm, the thickness of the hole injection layer 107 ranges from 5 nm to 20 nm, the thickness of the first hole transport layer 104 ranges from 5 nm to 20 nm, and the thickness of the first electron block layer 109 ranges from 5 nm to 20 nm.

Referring to FIG. 3, the organic light-emitting diode 1 further includes a first hole block layer (HBL) 110 and an electron injection layer (EIL) 111 which are disposed between the second emission layer 1032 and the second electrode 102 and are sequentially laminated in the direction going away from the base substrate 2.

In some embodiments, the thickness of the first hole block layer 110 ranges from 5 nm to 20 nm, and the thickness of the electron injection layer 111 ranges from 80 nm to 100 nm. Alternatively, the thickness of the first hole block layer 110 ranges from 15 nm to 30 nm, and the thickness of the electron injection layer 111 ranges from 180 nm to 200 nm.

Referring to FIG. 3, the organic light-emitting diode 1 further includes a second hole block layer 112, a first charge generation layer (CGL) 113 and a fourth hole transport layer 114 which are disposed between the first emission layer 1031 and the third emission layer 1033. The second hole block layer 112, the first charge generation layer 113, the fourth hole transport layer 114 and the first hole transport layer 104 are sequentially laminated in the direction going away from the base substrate 2.

In some embodiments, the thickness of the second hole block layer 112 ranges from 5 nm to 20 nm, the thickness of the first charge generation layer 113 ranges from 5 nm to 10 nm, and the thickness of the fourth hole transport layer 114 ranges from 5 nm to 10 nm.

Referring to FIG. 3, the organic light-emitting diode 1 further includes a second charge generation layer 115, a fifth hole transport layer 116 and a second electron block layer 117 which are disposed between the third emission layer 1033 and the second emission layer 1032. The second charge generation layer 115, the fifth hole transport layer 116, the second hole transport layer 105, and the second electron block layer 117 are sequentially laminated in the direction going away from the base substrate 2.

In some embodiments, the thickness of the second charge generation layer 115 ranges from 5 nm to 20 nm, the thickness of the fifth hole transport layer 116 ranges from 5 nm to 20 nm, and the thickness of the second electron block layer 117 ranges from 5 nm to 20 nm.

Additionally, in the embodiments of the present disclosure, the thickness of the first emission layer 1031 ranges from 10 nm to 30 nm, the thickness of the second emission layer 1032 ranges from 10 nm to 30 nm, the thickness of the third emission layer 1033 ranges from 30 nm to 60 nm, and the thickness of the second electrode 102 ranges from 80 nm to 120 nm.

In the embodiments of the present disclosure, the optical performance of the organic light-emitting diode 1 can be ensured by setting different thicknesses. In some embodiments, the following solutions for the thicknesses are provided.

In a first solution, referring to FIG. 4, the thicknesses of the film layers laminated in the direction going away from the base substrate 2 are as follows. The thickness of the reflective layer 106 ranges from 50 nm to 100 nm; the thickness of the first electrode 101 ranges from 5 nm to 20 nm; the thickness of the hole injection layer 107 ranges from 5 nm to 20 nm; the thickness of the third hole transport layer 108 ranges from 90 nm to 130 nm; the thickness of the first electron block layer 109 ranges from 5 nm to 20 nm; the thickness of the first emission layer 1031 ranges from 10 nm to 30 nm; the thickness of the second hole block layer 112 ranges from 5 nm to 20 nm; the thickness of the first charge generation layer 113 ranges from 5 nm to 10 nm; the thickness of the fourth hole transport layer 114 ranges from 5 nm to 10 nm; the thickness of the first hole transport layer 104 ranges from 5 nm to 10 nm; the thickness of the fourth emission layer 1034 ranges from 5 nm to 20 nm; the thickness of the third emission layer 1033 ranges from 30 nm to 60 nm; the thickness of the second charge generation layer 115 ranges from 5 nm to 20 nm; the thickness of the fifth hole transport layer 116 ranges from 5 nm to 20 nm; the thickness of the second hole transport layer 105 ranges from 150 nm to 200 nm; the thickness of the second electron block layer 117 ranges from 5 nm to 20 nm; the thickness of the second emission layer 1032 ranges from 10 nm to 30 nm; the thickness of the first hole block layer 110 ranges from 5 nm to 20 nm; the thickness of the electron injection layer 111 ranges from 80 nm to 100 nm; and the thickness of the second electrode 102 ranges from 80 nm to 120 nm.

In the first solution, the distance between the side of the second emission layer 1032 close to the base substrate 2 and the reflective layer 106 ranges from 335 nm to 610 nm, and the distance between the side of the second emission layer 1032 close to the base substrate 2 and the second electrode 102 ranges from 95 nm to 150 nm.

In a second solution, referring to FIG. 5, the thicknesses of the film layers laminated in the direction going away from the base substrate 2 are as follows. The thickness of the reflective layer 106 ranges from 50 nm to 100 nm; the thickness of the first electrode 101 ranges from 5 nm to 10 nm; the thickness of the hole injection layer 107 ranges from 5 nm to 10 nm; the thickness of the third hole transport layer 108 ranges from 5 nm to 50 nm; the thickness of the first electron block layer 109 ranges from 5 nm to 10 nm; the thickness of the first emission layer 1031 ranges from 10 nm to 30 nm; the thickness of the second hole block layer 112 ranges from 5 nm to 20 nm; the thickness of the first charge generation layer 113 ranges from 5 nm to 10 nm; the thickness of the fourth hole transport layer 114 ranges from 5 nm to 10 nm; the thickness of the first hole transport layer 104 ranges from 5 nm to 10 nm; the thickness of the fourth emission layer 1034 ranges from 5 nm to 20 nm; the thickness of the third emission layer 1033 ranges from 30 nm to 60 nm; the thickness of the second charge generation layer 115 ranges from 5 nm to 20 nm; the thickness of the fifth hole transport layer 116 ranges from 5 nm to 20 nm; the thickness of the second hole transport layer 105 ranges from 150 nm to 200 nm; the thickness of the second electron block layer 117 ranges from 5 nm to 20 nm; the thickness of the second emission layer 1032 ranges from 10 nm to 30 nm; the thickness of the first hole block layer 110 ranges from 5 nm to 20 nm; the thickness of the electron injection layer 111 ranges from 80 nm to 100 nm; and the thickness of the second electrode 102 ranges from 80 nm to 120 nm.

In the second solution, the distance between the side of the second emission layer 1032 close to the base substrate 2 and the reflective layer 106 ranges from 250 nm to 500 nm, and the distance between the side of the second emission layer 1032 close to the base substrate 2 and the second electrode 102 ranges from 95 nm to 150 nm.

In a third solution, referring to FIG. 6, the thicknesses of the film layers laminated in the direction going away from the base substrate 2 are as follows. The thickness of the reflective layer 106 ranges from 50 nm to 100 nm; the thickness of the first electrode 101 ranges from 5 nm to 20 nm; the thickness of the hole injection layer 107 ranges from 20 nm to 35 nm; the thickness of the third hole transport layer 108 ranges from 170 nm to 210 nm; the thickness of the first electron block layer 109 ranges from 20 nm to 35 nm; the thickness of the first emission layer 1031 ranges from 10 nm to 30 nm; the thickness of the second hole block layer 112 ranges from 5 nm to 20 nm; the thickness of the first charge generation layer 113 ranges from 5 nm to 10 nm; the thickness of the fourth hole transport layer 114 ranges from 5 nm to 10 nm; the thickness of the first hole transport layer 104 ranges from 5 nm to 10 nm; the thickness of the fourth emission layer 1034 ranges from 5 nm to 20 nm; the thickness of the third emission layer 1033 ranges from 30 nm to 60 nm; the thickness of the second charge generation layer 115 ranges from 5 nm to 20 nm; the thickness of the fifth hole transport layer 116 ranges from 5 nm to 20 nm; the thickness of the second hole transport layer 105 ranges from 150 nm to 200 nm; the thickness of the second electron block layer 117 ranges from 5 nm to 20 nm; the thickness of the second emission layer 1032 ranges from 10 nm to 30 nm; the thickness of the first hole block layer 110 ranges from 5 nm to 20 nm; the thickness of the electron injection layer 111 ranges from 80 nm to 100 nm; and the thickness of the second electrode 102 ranges from 80 nm to 120 nm.

In the third solution, the distance between the side of the second emission layer 1032 close to the base substrate 2 and the reflective layer 106 ranges from 425 nm to 720 nm, and the distance between the side of the second emission layer 1032 close to the base substrate 2 and the second electrode 102 ranges from 95 nm to 150 nm.

In a fourth solution, referring to FIG. 7, the thicknesses of the film layers laminated in a direction going away from the base substrate 2 are as follows. The thickness of the reflective layer 106 ranges from 50 nm to 100 nm; the thickness of the first electrode 101 ranges from 80 nm to 100 nm; the thickness of the hole injection layer 107 ranges from 5 nm to 20 nm; the thickness of the third hole transport layer 108 ranges from 5 nm to 20 nm; the thickness of the first electron block layer 109 ranges from 5 nm to 20 nm; the thickness of the first emission layer 1031 ranges from 10 nm to 30 nm; the thickness of the second hole block layer 112 ranges from 5 nm to 20 nm; the thickness of the first charge generation layer 113 ranges from 5 nm to 10 nm; the thickness of the fourth hole transport layer 114 ranges from 5 nm to 10 nm; the thickness of the first hole transport layer 104 ranges from 5 nm to 10 nm; the thickness of the fourth emission layer 1034 ranges from 5 nm to 20 nm; the thickness of the third emission layer 1033 ranges from 30 nm to 60 nm; the thickness of the second charge generation layer 115 ranges from 5 nm to 20 nm; the thickness of the fifth hole transport layer 116 ranges from 5 nm to 20 nm; the thickness of the second hole transport layer 105 ranges from 150 nm to 200 nm; the thickness of the second electron block layer 117 ranges from 5 nm to 20 nm; the thickness of the second emission layer 1032 ranges from 10 nm to 30 nm; the thickness of the first hole block layer 110 ranges from 5 nm to 20 nm; the thickness of the electron injection layer 111 ranges from 80 nm to 100 nm; and the thickness of the second electrode 102 ranges from 80 nm to 120 nm.

In the fourth solution, the distance between the side of the second emission layer 1032 close to the base substrate 2 and the reflective layer 106 ranges from 325 nm to 580 nm, and the distance between the side of the second emission layer 1032 close to the base substrate 2 and the second electrode 102 ranges from 95 nm to 150 nm.

In a fifth solution, referring to FIG. 8, the thicknesses of the film layers laminated in a direction going away from the base substrate 2 are as follows. The thickness of the reflective layer 106 ranges from 50 nm to 100 nm; the thickness of the first electrode 101 ranges from 5 nm to 20 nm; the thickness of the hole injection layer 107 ranges from 5 nm to 20 nm; the thickness of the third hole transport layer 108 ranges from 90 nm to 130 nm; the thickness of the first electron block layer 109 ranges from 5 nm to 20 nm; the thickness of the first emission layer 1031 ranges from 10 nm to 30 nm; the thickness of the second hole block layer 112 ranges from 5 nm to 20 nm; the thickness of the first charge generation layer 113 ranges from 5 nm to 10 nm; the thickness of the fourth hole transport layer 114 ranges from 5 nm to 10 nm; the thickness of the first hole transport layer 104 ranges from 5 nm to 10 nm; the thickness of the fourth emission layer 1034 ranges from 5 nm to 20 nm; the thickness of the third emission layer 1033 ranges from 30 nm to 60 nm; the thickness of the second charge generation layer 115 ranges from 5 nm to 20 nm; the thickness of the fifth hole transport layer 116 ranges from 5 nm to 20 nm; the thickness of the second hole transport layer 105 ranges from 150 nm to 200 nm; the thickness of the second electron block layer 117 ranges from 5 nm to 20 nm; the thickness of the second emission layer 1032 ranges from 10 nm to 30 nm; the thickness of the first hole block layer 110 ranges from 15 nm to 30 nm; the thickness of the electron injection layer 111 ranges from 180 nm to 200 nm; and the thickness of the second electrode 102 ranges from 80 nm to 120 nm.

In the fifth solution, the distance between the side of the second emission layer 1032 close to the base substrate 2 and the reflective layer 106 ranges from 335 nm to 610 nm, and the distance between the side of the second emission layer 1032 close to the base substrate 2 and the second electrode 102 ranges from 205 nm to 260 nm.

In the embodiments of the present disclosure, the first hole transport layer 104, the second hole transport layer 105, and the third hole transport layer 108 are all conventional hole transport layers, denoted as HTL. The fourth hole transport layer 114 and the fifth hole transport layer 116 are both P-type hole transport layers, denoted as P-HTL. The P-type hole transport layer refers to a conventional hole transport layer doped with a material with a relatively low LUMO energy level, for example, a conventional hole transport layer doped with HATCN at a doping ratio from 4% to 20%.

Furthermore, the first charge generation layer 113 and the second charge generation layer 115 are both conventional electron transport layers doped with lithium, or conventional electron transport layers doped with hydroxyquinolinolato-lithium and ytterbium at a doping ratio from 1.5% to 10%. The first charge generation layer 113 and the second charge generation layer 115 are both denoted as N-CGL.

In summary, the embodiments of the present disclosure provide an organic light-emitting diode. The organic light-emitting diode includes a first electrode, a second electrode, at least two emission layers, a first hole transport layer and a second hole transport layer. The second hole transport layer is relatively thicker, and the ratio of the thickness of the second hole transport layer to the thickness of the first hole transport layer is larger. Therefore, in the case that the thicknesses of other film layers between the first electrode and the second electrode vary, the second hole transport layer having a different thickness can be provided to adjust the microcavity length of the organic light-emitting diode, thereby ensuring the optical performance of the organic light-emitting diode and the display effect of the display panel.

The embodiments of the present disclosure further provide a display panel. As shown in FIG. 1 and FIG. 3, the display panel 01 includes a base substrate 2 and a plurality of organic light-emitting diodes 1 as described in the foregoing embodiments, and the plurality of organic light-emitting diodes 1 are disposed on a side of the base substrate 2. FIG. 1 and FIG. 3 illustratively show only one organic light-emitting diode.

Since the display panel has substantially the same technical effects as the organic light-emitting diode described in the foregoing embodiments, the technical effects of the display panel are not repeated here for the sake of brevity.

Figure 9:
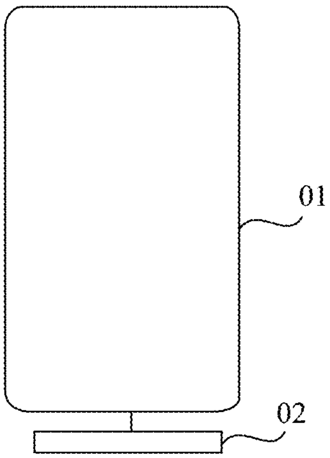
FIG. 9 is a schematic structural diagram of a display device according to some embodiments of the present disclosure.

FIG. 9 is a schematic structural diagram of a display device according to some embodiments of the present disclosure. Referring to FIG. 9, the display device includes a power supply assembly 02 and the display panel 01 as described in the foregoing embodiments. The power supply assembly 02 is configured to supply power to the display panel 01.

In some embodiments, the display device is an OLED display device, and the display device may be any display device, including but not limited to any product or component having a display function such as a mobile phone, a tablet computer, a television, a display, a notebook computer, a digital photo frame, a navigator, and an electronic book.

Since the display device has substantially the same technical effects as the organic light-emitting diode 1 described in the foregoing embodiments, the technical effects of the display device are not repeated here for the sake of brevity.

It is to be understood that although the terms of first, second and the like are used herein to describe various elements, components, regions, layers, and/or portions, these elements, components, regions, layers, and/or portions should not be limited by these terms. These terms are merely used to distinguish one element, component, region, layer, or portion from another region, layer, or portion. Accordingly, the first element, component, region, layer, or portion discussed above may be referred to as a second element, component, region, layer, or portion without departing from the teachings of the present disclosure.

Spatial relative terms such as "under," "on," "left," "right" may be used herein to describe the relationship between one element or feature and another element(s) or feature(s) as illustrated in the figures. It is to be understood that these spatial relative terms are intended to encompass different orientations of the devices in use or operation in addition to the orientations depicted in the figures. For example, if a device in the figure is turned upside down, the elements described as being "under another element or feature" will be oriented "on" the element or feature. Thus, the exemplary term "under" encompasses both orientations of "on" and "under". The devices may be oriented in other ways (rotated 90 degrees or otherwise) and the spatial relative descriptors used herein are interpreted accordingly. Furthermore, it is to be understood that when a layer is referred to as being "between two layers", it may be the only layer between the two layers, or one or more intermediate layers may also exist.

The terms used herein are merely for the purpose of describing particular embodiments and are not intended to limit the present disclosure. As used herein, the singular forms "a/an," "one," and "the" are intended to encompass the plural forms, unless the context clearly specifies otherwise. It will be further understood that the terms "comprising" and/or "including" used in this specification indicate the presence of the stated features, integers, steps, operations, elements, and/or components, without excluding the presence or addition of one or more of other features, integers, steps, operations, elements, components, and/or groups thereof. As used herein, the term "and/or" includes any one of the associated listed items or any and all combinations of more of the associated listed items. The specific features, structures, materials or characteristics described in this specification may be combined in any one or more embodiments or examples in a suitable manner. In addition, different embodiments or examples described and features of different embodiments or examples in this specification may be combined, without contradicting each other.

Unless otherwise defined, all terms (including technical and scientific terms) used herein have the same meaning as commonly understood by one of ordinary skill in the art to which this disclosure pertains. It will be further understood that the terms such as those defined in commonly used dictionaries should be interpreted as having the meanings consistent with their meanings in the relevant art and/or context of this specification and shall not be interpreted in an idealized or overly formal sense unless expressly so defined herein.

The above descriptions are merely optional embodiments of the present disclosure, and are not intended to limit the present disclosure. Any modifications, equivalent substitutions, improvements and the like made within the spirit and principles of the present disclosure shall be included within the protection scope of the present disclosure.

What is claimed is:

1. An organic light-emitting diode, wherein the organic light-emitting diode comprises: a first electrode, a second electrode, at least two emission layers, a first hole transport layer and a second hole transport layer; wherein a color of a mixture of light emitted from the at least two emission layers is white, and the at least two emission layers comprise a first emission layer and a second emission layer, wherein the first electrode, the first emission layer, the first hole transport layer, the second hole transport layer, the second emission layer, and the second electrode are disposed on a base substrate and are sequentially laminated in a direction going away from the base substrate;

a thickness of the second hole transport layer ranges from 150 nm to 200 nm, and a ratio of the thickness of the second hole transport layer to a thickness of the first hole transport layer ranges from 15 to 40.

2. The organic light-emitting diode according to claim 1, wherein the thickness of the first hole transport layer ranges from 5 nm to 10 nm.

3. The organic light-emitting diode according to claim 1, wherein the at least two emission layers further comprise: a third emission layer disposed between the first emission layer and the second emission layer; wherein a color of light emitted from the first emission layer is the same as a color of light emitted from the second emission layer, and a color of light emitted from the third emission layer is different from the color of the light emitted from the first emission layer.

4. The organic light-emitting diode according to claim 3, wherein the first hole transport layer is disposed between the first emission layer and the third emission layer, and the second hole transport layer is disposed between the third emission layer and the second emission layer.

5. The organic light-emitting diode according to claim 3, wherein the at least two emission layers further comprise: a fourth emission layer disposed between the first emission layer and the third emission layer; wherein a color of light emitted from the fourth emission layer is different from the color of the light emitted from the first emission layer, and is different from the color of the light emitted from the third emission layer.

6. The organic light-emitting diode according to claim 5, wherein the organic light-emitting diode further comprises: a reflective layer disposed on a side of the first electrode close to the base substrate, and a hole injection layer, a third hole transport layer and a first electron block layer which are disposed between the first electrode and the first emission layer and are sequentially laminated in the direction going away from the base substrate; wherein a thickness of the reflective layer ranges from 50 nm to 100 nm, a thickness of the first electrode ranges from 5 nm to 20 nm, a thickness of the hole injection layer ranges from 5 nm to 20 nm, a thickness of the third hole transport layer ranges from 90 nm to 130 nm, and a thickness of the first electron block layer ranges from 5 nm to 20 nm.

7. The organic light-emitting diode according to claim 6, wherein the organic light-emitting diode further comprises: a first hole block layer and an electron injection layer which are disposed between the second emission layer and the second electrode and are sequentially laminated in the direction going away from the base substrate; wherein a thickness of the first hole block layer ranges from 5 nm to 20 nm, and a thickness of the electron injection layer ranges from 80 nm to 100 nm.

8. The organic light-emitting diode according to claim 6, wherein the organic light-emitting diode further comprises: a first hole block layer and an electron injection layer which are disposed between the second emission layer and the second electrode and are sequentially laminated in the direction going away from the base substrate; wherein a thickness of the first hole block layer ranges from 15 nm to 30 nm, and a thickness of the electron injection layer ranges from 180 nm to 200 nm.

9. The organic light-emitting diode according to claim 5, wherein the organic light-emitting diode further comprises: a reflective layer disposed on a side of the first electrode close to the base substrate, and a hole injection layer, a third hole transport layer and a first electron block layer which are disposed between the first electrode and the first emission layer and are sequentially laminated in the direction going away from the base substrate; wherein a thickness of the reflective layer ranges from 50 nm to 100 nm, a thickness of the first electrode ranges from 5 nm to 10 nm, a thickness of the hole injection layer ranges from 5 nm to 10 nm, a thickness of the third hole transport layer ranges from 5 nm to 50 nm, and a thickness of the first electron block layer ranges from 5 nm to 10 nm.

10. The organic light-emitting diode according to claim 5, wherein the organic light-emitting diode further comprises: a reflective layer disposed on a side of the first electrode close to the base substrate, and a hole injection layer, a third hole transport layer and a first electron block layer which are disposed between the first electrode and the first emission layer and are sequentially laminated in the direction going away from the base substrate; wherein a thickness of the reflective layer ranges from 50 nm to 100 nm, a thickness of the first electrode ranges from 5 nm to 20 nm, a thickness of the hole injection layer ranges from 20 nm to 25 nm, a thickness of the third hole transport layer ranges from 170 nm to 210 nm, and a thickness of the first electron block layer ranges from 20 nm to 35 nm.

11. The organic light-emitting diode according to claim 5, wherein the organic light-emitting diode further comprises: a reflective layer disposed on a side of the first electrode close to the base substrate, and a hole injection layer, a third hole transport layer and a first electron block layer which are disposed between the first electrode and the first emission layer and are sequentially laminated in the direction going away from the base substrate; wherein a thickness of the reflective layer ranges from 50 nm to 100 nm, a thickness of the first electrode ranges from 80 nm to 100 nm, a thickness of the hole injection layer ranges from 5 nm to 20 nm, a thickness of the third hole transport layer ranges from 5 nm to 20 nm, and a thickness of the first electron block layer ranges from 5 nm to 20 nm.

12. The organic light-emitting diode according to claim 3, wherein the organic light-emitting diode further comprises: a second hole block layer, a first charge generation layer and a fourth hole transport layer which are disposed between the first emission layer and the third emission layer, wherein the second hole block layer, the first charge generation layer, the fourth hole transport layer and the first hole transport layer are sequentially laminated in the direction going away from the base substrate; wherein a thickness of the second hole block layer ranges from 5 nm to 20 nm, a thickness of the first charge generation layer ranges from 5 nm to 10 nm, and a thickness of the fourth hole transport layer ranges from 5 nm to 10 nm.

13. The organic light-emitting diode according to claim 3, wherein the organic light-emitting diode further comprises: a second charge generation layer, a fifth hole transport layer and a second electron block layer which are disposed between the third emission layer and the second emission layer, wherein the second charge generation layer, the fifth hole transport layer, the first hole transport layer and the second electron block layer are sequentially laminated in the direction going away from the base substrate; wherein a thickness of the second charge generation layer ranges from 5 nm to 20 nm, a thickness of the fifth hole transport layer ranges from 5 nm to 20 nm, and a thickness of the second electron block layer ranges from 5 nm to 20 nm.

14. The organic light-emitting diode according to claim 3, wherein a thickness of the first emission layer ranges from 10 nm to 30 nm, a thickness of the second emission layer ranges from 10 nm to 30 nm, a thickness of the third emission layer ranges from 30 nm to 60 nm, and a thickness of the second electrode ranges from 80 nm to 120 nm.

15. A display panel, wherein the display panel comprises: a base substrate, and a plurality of organic light-emitting diodes; wherein the plurality of organic light-emitting diodes are disposed on a side of the base substrate; and each of the plurality of organic light-emitting diodes comprises: a first electrode, a second electrode, at least two emission layers, a first hole transport layer and a second hole transport layer; wherein a color of a mixture of light emitted from the at least two emission layers is white, and the at least two emission layers comprise a first emission layer and a second emission layer, wherein the first electrode, the first emission layer, the first hole transport layer, the second hole transport layer, the second emission layer, and the second electrode are disposed on the base substrates and are sequentially laminated in a direction going away from the base substrate;

a thickness of the second hole transport layer ranges from 150 nm to 200 nm, and a ratio of the thickness of the second hole transport layer to a thickness of the first hole transport layer ranges from 15 to 40.

16. A display device, comprising: a power supply assembly and a display panel; wherein the power supply assembly is configured to supply power to the display panel; and the display panel comprises: a base substrate, and a plurality of organic light-emitting diodes; wherein the plurality of organic light-emitting diodes are disposed on a side of the base substrate; and each of the plurality of organic light-emitting diodes comprises: a first electrode, a second electrode, at least two emission layers, a first hole transport layer and a second hole transport layer; wherein a color of a mixture of light emitted from the at least two emission layers is white, and the at least two emission layers comprise a first emission layer and a second emission layer, wherein the first electrode, the first emission layer, the first hole transport layer, the second hole transport layer, the second emission layer, and the second electrode are disposed on the base substrates and are sequentially laminated in a direction going away from the base substrate;

a thickness of the second hole transport layer ranges from 150 nm to 200 nm, and a ratio of the thickness of the second hole transport layer to a thickness of the first hole transport layer ranges from 15 to 40.

* * * * *